(12) United States Patent
Mogi

(10) Patent No.: US 9,780,339 B2
(45) Date of Patent: Oct. 3, 2017

(54) ORGANIC ELECTROLUMINESCENT PANEL UNIT

(71) Applicant: JOLED INC., Tokyo (JP)

(72) Inventor: Keiichi Mogi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/107,144

(22) PCT Filed: Nov. 14, 2014

(86) PCT No.: PCT/JP2014/005731
§ 371 (c)(1),
(2) Date: Jun. 22, 2016

(87) PCT Pub. No.: WO2015/097973
PCT Pub. Date: Jul. 2, 2015

(65) Prior Publication Data
US 2017/0033310 A1    Feb. 2, 2017

(30) Foreign Application Priority Data

Dec. 27, 2013 (JP) .................................. 2013-273279

(51) Int. Cl.
*H01L 51/52*    (2006.01)
*H01L 51/00*    (2006.01)
*G09G 3/3225*   (2016.01)

(52) U.S. Cl.
CPC ........ *H01L 51/529* (2013.01); *H01L 51/0096* (2013.01); *H01L 51/5237* (2013.01);
(Continued)

(58) Field of Classification Search
CPC ............... H01L 51/529; H01L 51/0096; H01L 51/5237
See application file for complete search history.

(56) References Cited

U.S. PATENT DOCUMENTS 7,153,552 B2 * 12/2006 Kubo ................... G02B 5/3025
349/117
7,179,520 B2 *  2/2007 Saeki ..................... H05K 1/028
174/254
(Continued)

FOREIGN PATENT DOCUMENTS

JP    11-097587    4/1999
JP    2009-272073    11/2009
(Continued)

OTHER PUBLICATIONS

International Search Report issued in International Patent Application No. PCT/JP2014/005731, dated Feb. 3, 2015.

*Primary Examiner* — Ida M Soward
(74) *Attorney, Agent, or Firm* — Greenblum & Bernstein, P.L.C.

(57) ABSTRACT

An organic electroluminescent (EL) panel unit includes: an organic EL panel that displays an image on a front surface thereof; and a plurality of sheet members attached to a panel back surface which is a back surface of the organic EL panel. The plurality of sheet members are each formed by rolling a metal sheet, and the plurality of sheet members include two sheet members that are attached to the panel back surface such that a portion of one of the two sheet members is disposed adjacent to a portion of the other sheet member and the two sheet members have mutually different rolling directions.

7 Claims, 12 Drawing Sheets

(52) U.S. Cl.
CPC ... *G09G 3/3225* (2013.01); *G09G 2300/0842* (2013.01); *G09G 2330/045* (2013.01); *G09G 2380/02* (2013.01); *Y02E 10/549* (2013.01)

(56) References Cited

U.S. PATENT DOCUMENTS

| | | | | |
|---|---|---|---|---|
| 7,391,935 | B2* | 6/2008 | Kawahara | G02B 5/3083 |
| | | | | 349/117 |
| 8,242,387 | B2 | 8/2012 | Yoneda et al. | |
| 8,446,549 | B2* | 5/2013 | Huitema | G02B 5/201 |
| | | | | 349/106 |
| 8,576,555 | B2* | 11/2013 | Misawa | G02F 1/133305 |
| | | | | 345/156 |
| 2010/0026940 | A1* | 2/2010 | Takegami | B29C 55/00 |
| | | | | 349/102 |
| 2010/0059271 | A1 | 3/2010 | Yoneda et al. | |
| 2010/0182288 | A1* | 7/2010 | Misawa | G02F 1/133305 |
| | | | | 345/204 |
| 2011/0070461 | A1* | 3/2011 | Yamada | C21D 6/002 |
| | | | | 428/687 |
| 2011/0227822 | A1* | 9/2011 | Shai | G06F 1/1615 |
| | | | | 345/156 |
| 2012/0329528 | A1* | 12/2012 | Song | H04M 1/0268 |
| | | | | 455/566 |
| 2013/0265221 | A1* | 10/2013 | Lee | G06F 3/01 |
| | | | | 345/156 |
| 2013/0301154 | A1* | 11/2013 | Huitema | G02B 5/201 |
| | | | | 359/891 |
| 2014/0015743 | A1* | 1/2014 | Seo | G06F 1/1694 |
| | | | | 345/156 |
| 2014/0029017 | A1* | 1/2014 | Lee | G01B 11/24 |
| | | | | 356/601 |
| 2015/0220118 | A1* | 8/2015 | Kwak | G06F 3/14 |
| | | | | 345/667 |
| 2015/0220119 | A1* | 8/2015 | Seo | G06F 3/041 |
| | | | | 345/173 |

FOREIGN PATENT DOCUMENTS

JP  2013-097157  5/2013
WO  2008/013279  1/2008

* cited by examiner

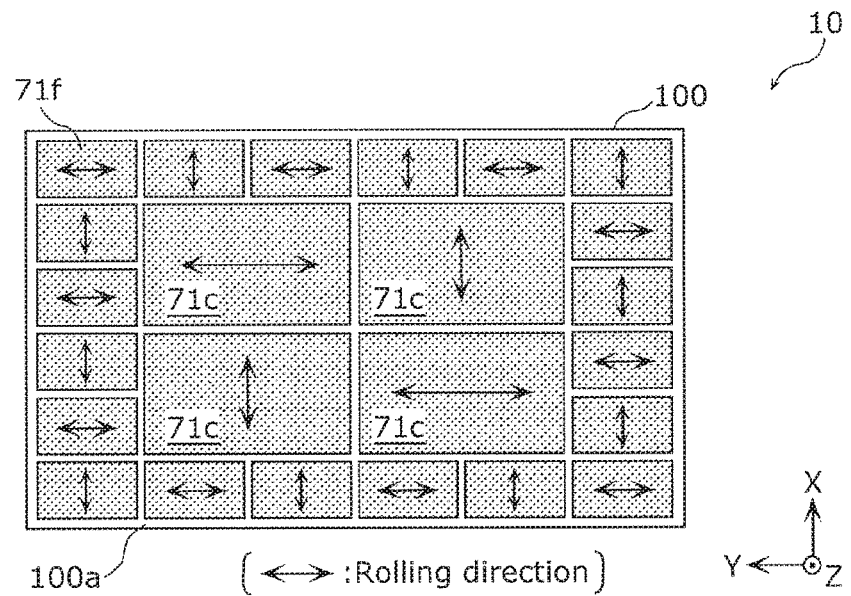
FIG. 11
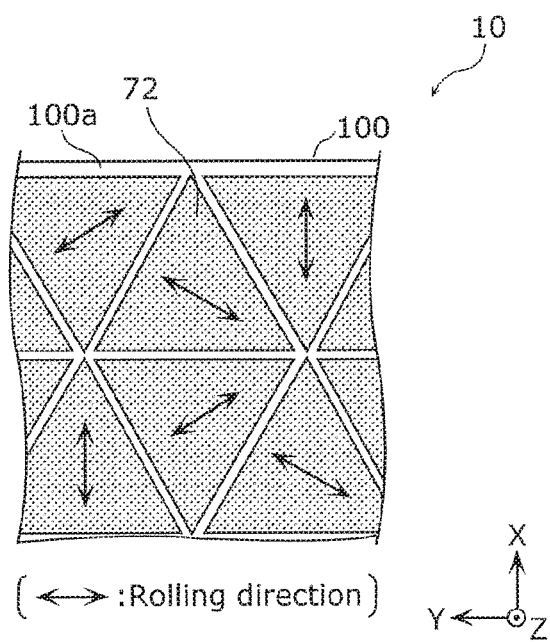

(↔ :Rolling direction)

ORGANIC ELECTROLUMINESCENT PANEL UNIT

TECHNICAL FIELD

The present disclosure relates to an organic electroluminescent (EL) panel unit including an organic EL panel.

BACKGROUND ART

An image display apparatus such as a television set includes a display panel such as an organic EL panel. Patent Literature (PTL) 1 discloses a display apparatus including a heat conductive layer that conducts heat generated in the display panel. The density of the heat conductive layer of the display apparatus is higher in a second region than in a first region, the first region being a region that includes a central point of a display region or is defined near the central point, and the second region being spaced apart from the central point.

Patent Literature 1 discloses that the above-described configuration suppresses a local temperature increase in a central region of the display panel.

CITATION LIST

Patent Literature

[PTL 1] Japanese Unexamined Patent Application Publication No. 2013-97157

SUMMARY OF INVENTION

Technical Problem

The present disclosure provides an organic EL panel unit and an organic EL display apparatus in which heat dissipation from the organic EL panel is efficiently performed, and deformation of the organic EL panel caused by a temperature change can be suppressed.

Solution to Problem

An organic EL panel unit according to the present disclosure includes an organic EL panel that displays an image on a front surface thereof; and a plurality of sheet members attached to a panel back surface which is a back surface of the organic EL panel, the plurality of sheet members each being formed by rolling a metal sheet, wherein the plurality of sheet members include a first sheet member and a second sheet member, and the first sheet member and the second sheet member are attached to the panel back surface such that a portion of one of the first sheet member and the second sheet member is disposed adjacent to a portion of the other sheet member and the first sheet member and the second sheet member have mutually different rolling directions.

Advantageous Effects of Invention

With the organic EL panel unit according to the present disclosure, the heat dissipation from the organic EL panel can be efficiently performed, and the deformation of the organic EL panel caused by a temperature change can be suppressed. Accordingly, it is possible to provide a high-quality organic EL panel unit, a thin-type television set including such an organic EL panel unit, and the like.

BRIEF DESCRIPTION OF DRAWINGS

FIG. 5A is a diagram showing an example of the layout of a plurality of sheet members according to the embodiment.

FIG. 10C is a diagram showing a layout of a plurality of sheet members according to Variation 7 of the embodiment.

FIG. 11 is a diagram showing a portion of a layout of a plurality of sheet members according to Variation 8 of the embodiment.

DESCRIPTION OF EMBODIMENTS

The inventors of the present application have found that the following problems occur in conventional organic EL panels.

An organic EL panel has a configuration in which organic EL elements are disposed between two glass substrates. As an ordinary structure, an organic EL element includes a light-emitting layer that emits light in order to display an image, but due to a temperature increase caused by heat generated by the light-emitting element itself, the characteristics of the light-emitting layer irreversibly deteriorate.

Accordingly, efficient dissipation of heat generated in the organic EL panel is an important factor from the viewpoint of maintaining or improving, for example, the image quality of the organic EL panel.

Also, the organic EL panel is a self-emissive display panel, and thus is not required to include a backlight, such as that included in a liquid crystal display panel. For this reason, it is possible to implement a thin-type organic EL panel having a thickness of, for example, about 1 to 3 mm.

As a result, an organic EL display apparatus such as a television receiver (television set) including the organic EL panel is also required to be thinner.

Accordingly, in the case of, for example, attaching a heat-dissipation member such as a metal sheet to a back surface (panel back surface) of the organic EL panel, it is desirable to reduce the thickness as thin as possible.

An example of the heat-dissipation member that satisfies this demand is a heat-dissipation sheet that is a sheet-like member formed by rolling a sheet material made of a metal having a high thermal conductivity (for example, aluminum).

By attaching the heat-dissipation sheet to the organic EL panel so as to cover the panel back surface, the heat dissipation efficiency of the organic EL panel can be improved.

In this case, however, because the organic EL panel and the heat-dissipation sheet have different thermal expansion coefficients, under the influence of, for example, a temperature change in the surroundings of the organic EL panel unit, a warpage occurs in a structure (organic EL panel unit) including the organic EL panel and the heat-dissipation sheet.

The inventors of the present application found that, in the case where a warpage occurs in the organic EL panel unit as described above, the direction of warpage is affected by the rolling direction of the heat-dissipation sheet. As used herein, the term "rolling direction" is defined as, for example, a direction perpendicular to the axis of rollers used to roll a metal sheet, which is a material of the heat-dissipation sheet.

Figure 1:
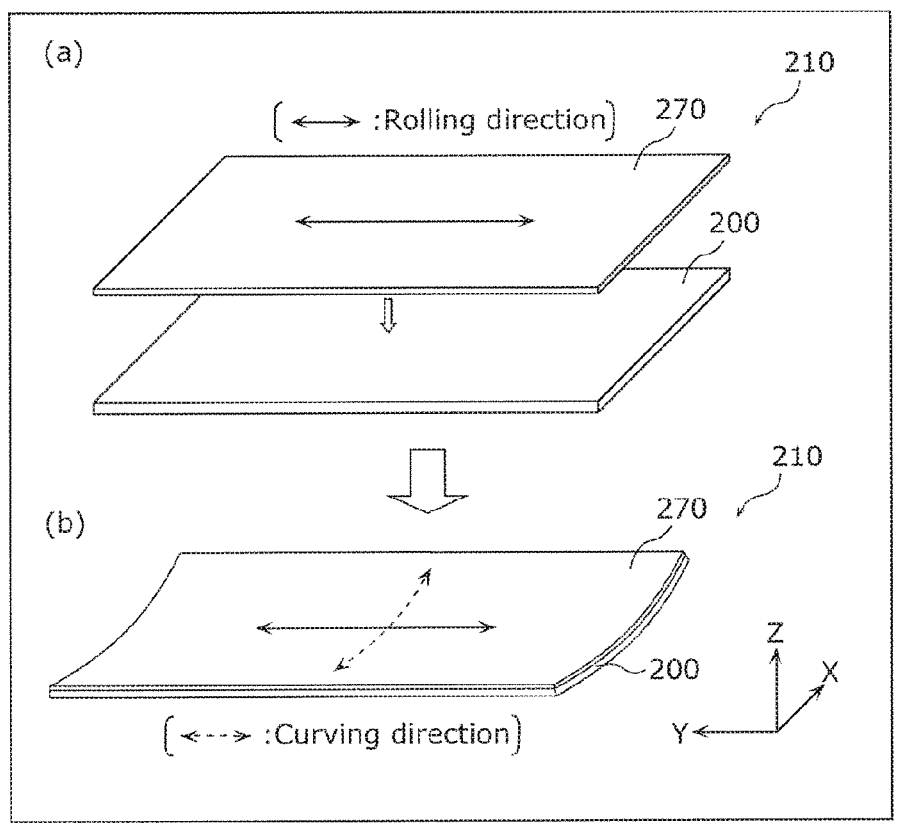
FIG. 1 is a schematic diagram showing a relationship between a direction of rolling of a heat-dissipation sheet and a direction of warpage of an organic EL panel unit.

FIG. 1 is a schematic diagram showing a relationship between a direction of rolling of a heat-dissipation sheet 270 and a direction of warpage of an organic EL panel unit 210, which is a result of an experiment conducted by the inventors of the present application.

For example, as shown in FIG. 1(a), a case will be considered where an organic EL panel unit 210 is obtained by attaching a heat-dissipation sheet 270 made of aluminum to a back surface of an organic EL panel 200.

In this case, if the organic EL panel unit 210 is cooled by, for example, the atmosphere of the installation environment, because the organic EL panel 200 and the heat-dissipation sheet 270 have different thermal expansion coefficients (linear expansion coefficients), the organic EL panel unit 210 is deformed.

To be specific, as shown in FIG. 1(a), when the heat-dissipation sheet 270 is disposed such that the direction of rolling of the heat-dissipation sheet 270 is parallel (or substantially parallel, the same applies hereinafter) to the long sides of the organic EL panel 200, the following deformation is observed.

That is, as shown in FIG. 1(b), a curvature in a widthwise direction (X axis direction) of the organic EL panel 200 is observed in the organic EL panel 200. In other words, a warpage in the widthwise direction occurs in the organic EL panel unit 210 as a whole. As used herein, an expression "an object such as a heat-dissipation sheet is curved (warped) in a certain direction" means that the object is curved (warped) in a circumferential direction of a cylinder centered about an axis perpendicular to the certain direction.

The warpage in the organic EL panel unit 210 as a whole as described above is considered to be caused primarily by the following reasons.

Because the linear expansion coefficient of the heat-dissipation sheet 270 made of aluminum is greater than the linear expansion coefficient of the organic EL panel 200 including two glass substrates as structural elements, if the entire organic EL panel unit 210 is cooled, the organic EL panel 200 is pulled by the heat-dissipation sheet 270. Accordingly, the organic EL panel unit 210 is warped toward the heat-dissipation sheet 270 side.

Also, the heat-dissipation sheet 270, which is rolled by rollers at the time of production, is rolled during a rolling process, for example, with a non-uniform pressure in a direction perpendicular to the rolling direction so as to cause the heat-dissipation sheet 270 to have a uniform thickness. To be specific, an aluminum metal sheet used as a material of the heat-dissipation sheet 270 is drawn such that a center portion in the direction perpendicular to the rolling direction is drawn with a pressure higher than the pressure used to draw two end portions in the direction perpendicular to the rolling direction.

As a result, in the heat-dissipation sheet 270, non-uniform crystal structures occur in the direction perpendicular to the rolling direction, and thus the heat-dissipation sheet 270 attains a property of more easily being expanded and contracted in the direction perpendicular to the rolling direction than in the rolling direction due to a temperature change.

That is, in the heat-dissipation sheet 270, a direction perpendicular to a direction in which a significant expansion or contraction occurs due to a temperature change is the rolling direction.

In order to suppress the deformation of the organic EL panel 200 caused by the characteristics of the heat-dissipation sheet 270 as described above, for example, a solution can be conceived in which the proportion of occupancy of the heat-dissipation sheet 270 in the back surface of the organic EL panel 200 is reduced. However, it cannot be said that it is an appropriate solution because it may lead to a reduction of heat dissipation efficiency in the organic EL panel unit 210.

Also, ideally, a method can also be conceived in which the linear expansion coefficient of the organic EL panel 200 is set so as to substantially match, for example, the linear expansion coefficient of the heat-dissipation sheet 270 made of aluminum or the like. However, this method is practically unrealistic in terms of the material that can be selected.

Also, in general, the organic EL panel is integrated into an organic EL display apparatus such as a television set by, for example, being held by a metal chassis disposed on the back surface side of the organic EL panel. Accordingly, the deformation of the organic EL panel unit (organic EL panel) may be suppressed by the chassis. However, the chassis is also required to be thinner, and thus the chassis itself has to have a structure in which it is difficult to form a flat surface. That is, if the chassis has a function of suppressing the deformation of the organic EL panel, the deformation of the chassis itself also appears in the organic EL panel.

As described above, if it is assumed that organic EL panels will be even thinner in the future, the suppression of the deformation of the organic EL panel caused by the characteristics of the heat-dissipation sheet is an important issue. Accordingly, it is important for an organic EL panel unit itself including an organic EL panel and a heat-dissipation sheet to have a configuration that can perform efficient heat dissipation and at the same time suppress deformation caused by a temperature change.

The present disclosure has been made based on the findings as described above, and as a result of in-depth research, the inventors of the present application arrived at an idea for the structure of an organic EL panel that enables heat dissipation from the organic EL panel to be performed efficiently and that suppresses the deformation of the organic EL panel caused by a temperature change even in a configuration in which the linear expansion coefficient of the organic EL panel and the linear expansion coefficient of the heat-dissipation sheet made of, for example, aluminum or the like are different.

Hereinafter, an embodiment will be described with reference to the drawings as appropriate. It is to be noted that an excessively detailed description may be omitted. For example, a detailed description of the already well-known matters and a redundant description of substantially the same configuration may be omitted. This aims to prevent the following description from being unnecessarily lengthy and to facilitate the understanding of a person having ordinary skill in the art.

Note that the inventors of the present application provide the accompanying drawings and the following description in order for a person having ordinary skill in the art to sufficiently understand the present disclosure, and thus the drawings and the description are not intended to limit the subject matter of the claims. Also, the drawings are schematic diagrams, and thus are not necessarily true to scale.

Hereinafter, an embodiment and variations of the embodiment will be described with reference to FIGS. 2 to 13. First, an overall configuration of an organic EL display apparatus according to the embodiment will be described with reference to FIGS. 2 and 3.

[1-1. Overall Configuration of Organic EL Display Apparatus]

Figure 2:
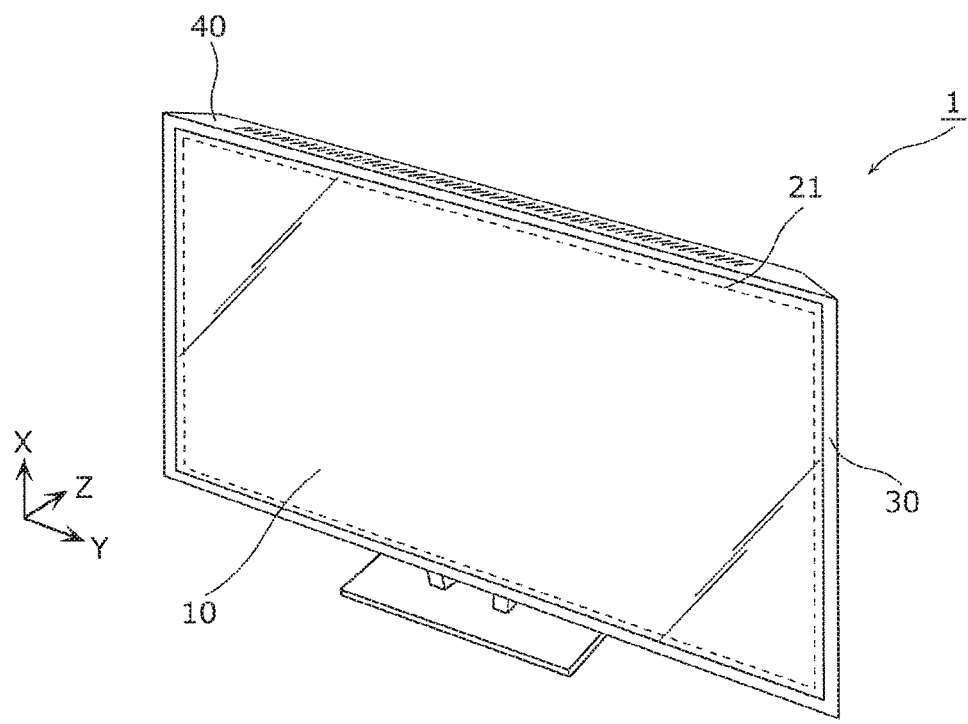
FIG. 2 is an external perspective view of the organic EL display apparatus according to an embodiment.

FIG. 2 is an external perspective view of an organic EL display apparatus 1 according to an embodiment.

Figure 3:
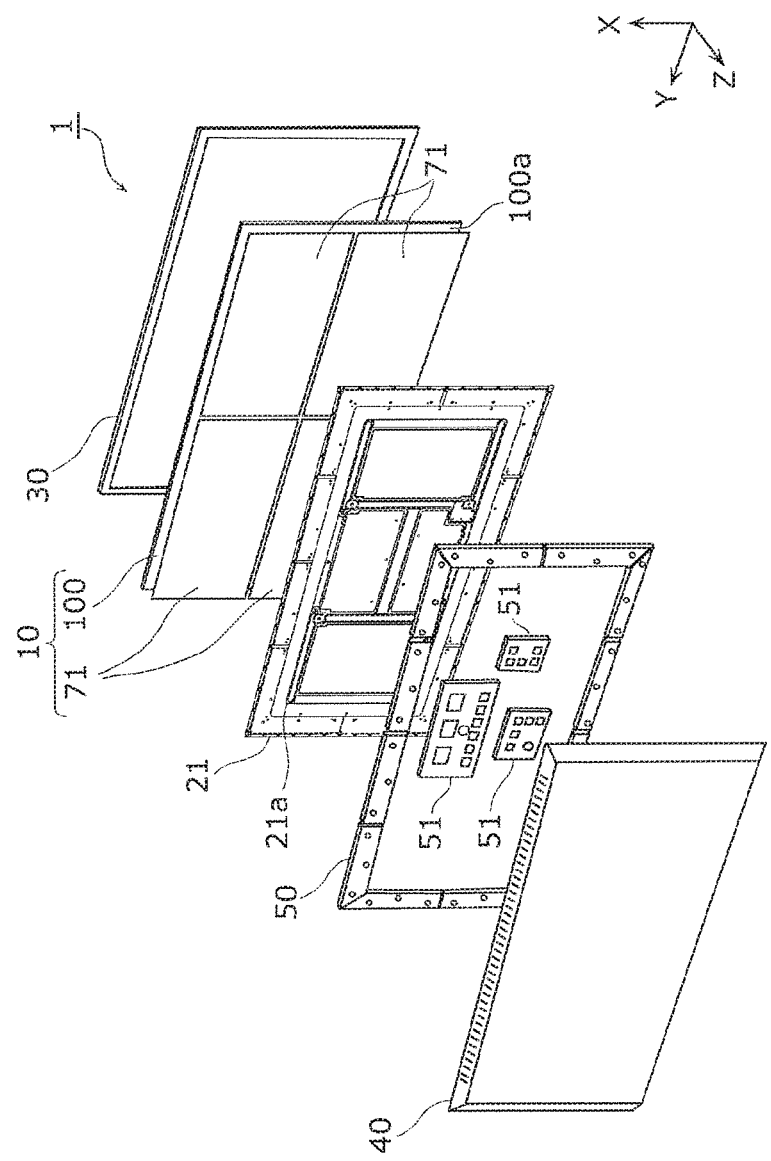
FIG. 3 is an exploded perspective view of the organic EL display apparatus according to the embodiment.

FIG. 3 is an exploded perspective view of the organic EL display apparatus 1 according to the embodiment.

Figure 4:
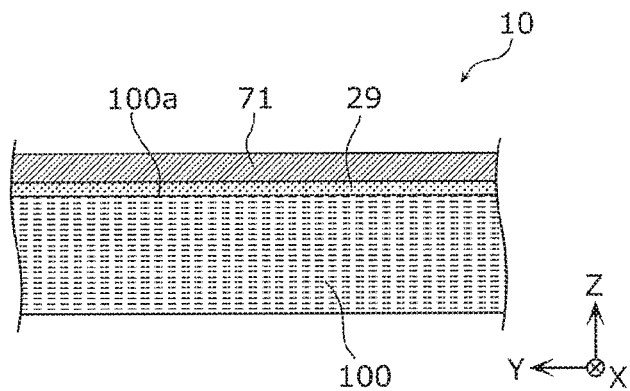
FIG. 4 is a partial cross-sectional view of the organic EL panel unit according to the embodiment.

FIG. 4 is a partial cross-sectional view of an organic EL panel unit 10 according to the embodiment.

As shown in FIGS. 2 and 3, the organic EL display apparatus 1 according to the present embodiment includes an organic EL panel unit 10 and a back cover 40 that is disposed so as to cover a back surface of the organic EL panel unit 10.

The organic EL panel unit 10 includes an organic EL panel 100 that displays an image on its front surface and a plurality of sheet members 71. The configuration of the organic EL panel 100 will be described later with reference to FIGS. 5 to 7.

The plurality of sheet members 71 are each formed by rolling a metal sheet, and they are attached to a panel back surface 100a, which is the back surface of the organic EL panel 100.

In the present embodiment, the organic EL panel unit 10 includes four sheet members 71, and the sheet members 71 are made of thin aluminum films formed by, for example, rolling.

Also, in the present embodiment, the four sheet members 71 are arranged in a direction parallel to the panel back surface 100a (in 2 rows×2 columns), and they are adhesively attached to the panel back surface 100a. To be specific, as shown in FIG. 4, each sheet member 71 is adhesively attached to the panel back surface 100a by an adhesive member 29. The adhesive member 29 is, for example, a pressure-sensitive adhesive sheet attached to a surface of the sheet member 71.

The sheet member 71 has a thickness of, for example, about 0.1 mm, and the adhesive member 29 has a thickness of, for example, about 0.05 mm.

Each of the sheet members 71 adhesively attached to the panel back surface 100a of the organic EL panel 100 in the manner described above functions as a heat-dissipation member (heat-dissipation sheet) that efficiently dissipates heat from the organic EL panel 100.

Also, in the organic EL panel unit 10 according to the present embodiment, by configuring at least two sheet members 71, when attached to the panel back surface 100a, to have rolling directions that are not the same, the deformation (warpage) of the organic EL panel 100 caused by a temperature change is suppressed. An example of the layout of the plurality of sheet members 71 and the effects thereof will be described later with reference to FIGS. 8A and 8B.

The organic EL display apparatus 1 according to the present embodiment further includes a chassis 21 that holds the organic EL panel unit 10, the chassis 21 being disposed on the back surface side of the organic EL panel unit 10, and circuit substrates 50 and 51. The circuit substrates 50 and 51 are disposed on a surface of the chassis 21, the surface being on a side opposite a side facing the organic EL panel unit 10.

Also, the organic EL display apparatus 1 further includes a rectangular frame (frame body) 30 that covers a perimeter of the front surface of the organic EL panel unit 10. The frame 30 and the back cover 40 are formed by using, for example, a resin material.

As described above, the organic EL display apparatus 1 has a structure in which the organic EL panel unit 10 and the chassis 21 to which the plurality of circuit substrates 50 and 51 are attached are disposed between the frame 30 and the back cover 40.

The organic EL display apparatus 1 as described above is implemented by, for example, a television receiver (television set) that outputs an image signal and an audio signal obtained from received broadcast waves or the like.

The plurality of circuit substrates 50 disposed on the back surface of the chassis 21 are driver circuit substrates provided with a driver circuit (driver) for supplying a signal voltage to the organic EL panel 100. The plurality of circuit substrates 50 are disposed so as to extend along the perimeter of the back surface of the chassis 21, and are connected to the organic EL panel 100 via flexible cables.

Also, the plurality of circuit substrates 51 are attached to a predetermined region including a center portion of the back surface of the chassis 21. These circuit substrates 51 include electronic circuits such as a signal processing circuit that processes a received image signal, a control circuit that controls the operations of a scanning driver circuit and a signal line driver circuit, and a power supply circuit that receives power from the outside and supplies the power to each circuit.

The organic EL display apparatus 1 also includes other elements that are not shown in FIG. 3 such as flexible cables that connect the circuit substrates 50 to the organic EL panel 100. However, in order to clearly show a feature of the organic EL display apparatus 1 according to the present disclosure, illustration and description of the other elements are omitted here.

The chassis 21 is, for example, a member made of a metal, and includes a protruding portion 21a protruding in a direction opposite to the organic EL panel 100. That is, to be brief, the chassis 21 has a shape in which the protruding portion 21a is formed on a flat plate-like body.

The chassis 21 according to the present embodiment is a member shaped by using, for example, a rectangular sheet material (metal sheet) made of a metal such as aluminum or iron and subjecting the sheet material to press processing such as drawing processing such that the protruding portion 21a is formed.

For example, the protruding portion 21a can be formed by subjecting an aluminum sheet having a thickness of 0.6 mm to drawing processing. By forming the protruding portion 21a (drawn portion) in this way, the rigidity of the chassis 21 can be improved.

In the present embodiment, the protruding portion 21a is composed of a plurality of step portions having mutually different height positions (the positions in a direction in which the protruding portion 21a protrudes (in a positive direction of Z axis)), but the protruding portion 21a may entirely have the same height.

The center portion, the perimeter portion and the like of the chassis 21 are regions in which the protruding portion 21a is not formed. By disposing the circuit substrates 50 and 51 in these regions, the influence of the thickness of the circuit substrates 50 and 51 on the thickness of the organic EL display apparatus 1 is suppressed.

A basic configuration of the organic EL panel 100 included in the organic EL display apparatus 1 configured as described above will be described next with reference to FIGS. 5 to 7.

[1-2. Organic EL Panel]

Figure 5:
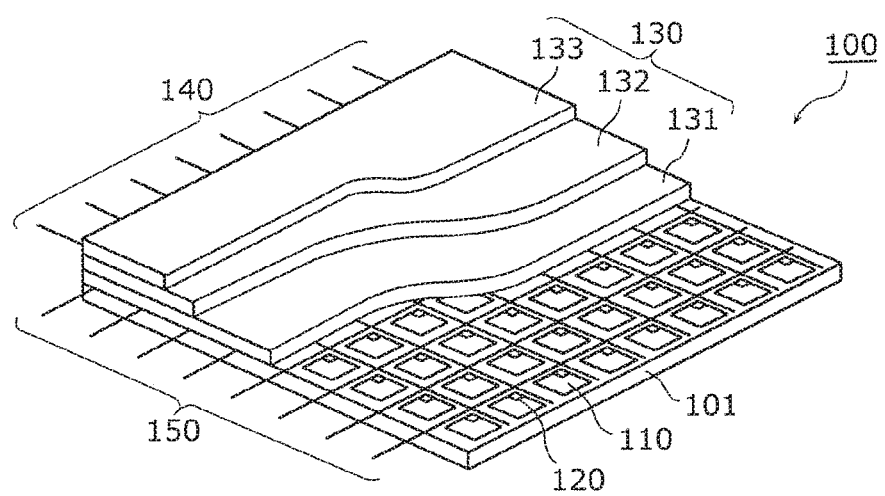
FIG. 5 is a partially cutaway perspective view showing the organic EL panel according to the embodiment.

FIG. 5 is a partially cutaway perspective view of the organic EL panel 100 according to the embodiment.

Figure 6:
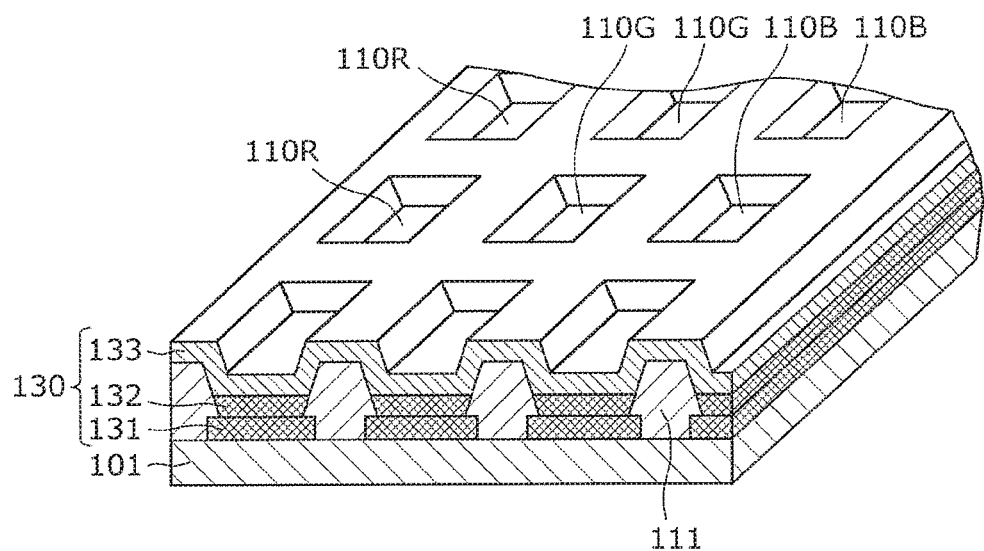
FIG. 6 is a perspective view showing an example of pixel banks in the organic EL panel according to the embodiment.

FIG. 6 is a perspective view showing an example of pixel banks in the organic EL panel 100 according to the embodiment.

As shown in FIG. 5, the organic EL panel 100 is configured to have a stacked structure in which a TFT substrate (TFT array substrate) 101 including a plurality of thin film transistors that are disposed therein and organic EL elements (light emitting portions) 130 are stacked. The organic EL elements 130 each include an anode 131 which is a lower electrode, an EL layer 132 which is a light-emitting layer made of an organic material, and a cathode 133 which is a transparent upper electrode.

The organic EL panel 100 includes a glass substrate that is disposed above the organic EL elements 130, but the illustration of the glass substrate is omitted in FIGS. 5 and 6.

The TFT substrate 101 has a structure in which, for example, various types of elements such as a gate electrode are stacked on a glass substrate.

That is, the organic EL panel 100 has, as a whole, a structure in which the organic EL elements 130 and the like are sandwiched by two glass substrates. The organic EL panel 100 having such a structure has a thickness of, for example, about 1 to 3 mm.

On the TFT substrate 101, a plurality of pixels 110 are arranged in a matrix, and each of the pixels 110 is provided with a pixel circuit 120.

The organic EL elements 130 are formed in one-to-one correspondence with the plurality of pixels 110, and the pixel circuits 120 included in the pixels 110 control light emission of the organic EL elements 130. The organic EL elements 130 are formed on an interlayer insulation film (planarization film) so as to cover the plurality of thin film transistors.

In addition, the organic EL elements 130 each have a configuration in which the EL layer 132 is disposed between the anode 131 and the cathode 133. A positive hole transport layer is further formed and stacked between the anode 131 and EL layer 132, and an electron transport layer is further formed and stacked between the EL layer 132 and the cathode 133. Another organic functional layer may be provided between the anode 131 and the cathode 133.

Each of the pixels 110 is driven and controlled by its pixel circuit 120. Also, in the TFT substrate 101, a plurality of gate lines (scanning lines) 140, a plurality of source lines (signal lines) 150 and a plurality of power supply lines (not shown in FIG. 5) are formed, the plurality of gate lines 140 being disposed along a row direction of the pixels 110, the plurality of source lines 150 being disposed along a column direction of the pixels 110 so as to intersect the gate lines 140, and the plurality of power supply lines being disposed in parallel to the source lines 150. The pixels 110 are separated by, for example, the perpendicularly intersecting gate lines 140 and source lines 150.

The gate lines 140 are each connected to one row of gate electrodes of the thin film transistors that are operative as switching elements included in the pixel circuits 120. The source lines 150 are each connected to one column of source electrodes of the thin film transistors that are operative as switching elements included in the pixel circuits 120. The power supply lines are each connected to one column of drain electrodes of the thin film transistors that are operative as driver elements included in the pixel circuits 120.

As shown in FIG. 6, each of the pixels 110 of the organic EL panel 100 includes sub pixels 110R, 110G and 110B of three different colors (red, green and blue). The sub pixels 110R, 110G and 110B are arranged in a matrix on the display surface.

The sub pixels 110R, 110G and 110B are separated from each other by banks 111. The banks 111 are formed in a grid pattern such that projections extending in parallel to the gate lines 140 and projections extending in parallel to the source lines 150 intersect with each other. The portions surrounded by the projections (in other words, openings of the banks 111) are in one-to-one correspondence with the sub pixels 110R, 110G and 110B. In the present embodiment, the banks 111 are configured as pixel banks, but may be configured as line banks.

The anodes 131 are formed, for the sub pixels 110R, 110G and 110B, on the interlayer insulation film (planarization film) formed on the TFT substrate 101 and within the openings of the banks 111. Likewise, the EL layers 132 are formed, for the sub pixels 110R, 110G and 110B, on the anodes 131 and within the openings of the banks 111. The transparent cathode 133 is continuously formed on the plurality of banks 111 so as to cover all of the EL layers 132 (all of the sub pixels 110R, 110G and 110B).

Furthermore, the pixel circuits 120 are provided in one-to-one correspondence with the sub pixels 110R, 110G and 110B, and the sub pixels 110R, 110G and 110B are electrically connected to the corresponding pixel circuits 120 by contact holes and relay electrodes. The sub pixels 110R, 110G and 110B have the same configuration except that the EL layers 132 emit light of different colors.

A circuit configuration of a pixel circuit 120 in a pixel 110 will now be described with reference to FIG. 7. FIG. 7 is an electric circuit diagram showing a configuration of a pixel circuit 120 included in the organic EL panel 100 according to the embodiment.

Figure 7:
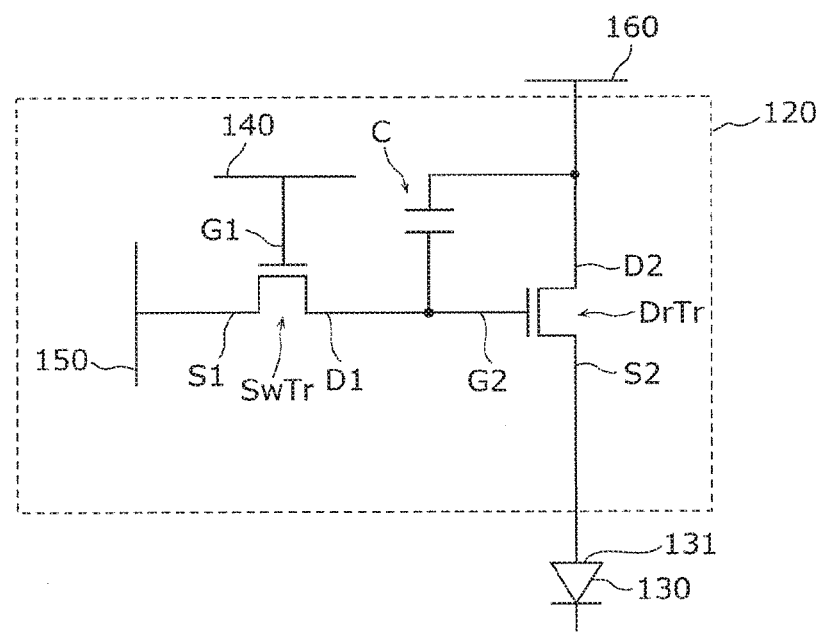
FIG. 7 is an electric circuit diagram showing a configuration of a pixel circuit in the organic EL panel according to the embodiment.

As shown in FIG. 7, the pixel circuit 120 includes a thin film transistor SwTr that is operative as a switching element, a thin film transistor DrTr that is operative as a driver element, and a capacitor C that stores data to be displayed using the corresponding pixel 110. In the present embodiment, the thin film transistor SwTr is a switching transistor for selecting a pixel 110, and the thin film transistor DrTr is a driving transistor for driving the organic EL elements 130.

The thin film transistor SwTr includes a gate electrode G1 connected to one of the gate lines 140, a source electrode S1 connected to one of the source lines 150, a drain electrode D1 connected to the capacitor C and a gate electrode G2 of the thin film transistor DrTr, and a semiconductor film (not shown). Upon application of a predetermined voltage to the gate line 140 and the source line 150 connected to the thin film transistor SwTr, the voltage applied to the source line 150 is stored, as a data voltage, into the capacitor C.

The thin film transistor DrTr includes a gate electrode G2 connected to the drain electrode D1 of the thin film transistor SwTr and the capacitor C, a drain electrode D2 connected to one of the power supply lines 160 and the capacitor C, a source electrode 52 connected to the anode 131 of the organic EL element 130, and a semiconductor film (not shown). The thin film transistor DrTr supplies a current corresponding to the data voltage stored in the capacitor C from the power supply line 160 to the anode 131 of the organic EL element 130 via the source electrode S2. Consequently, in the organic EL element 130, a drive current flows from the anode 131 to the cathode 133, thus causing the EL layer 132 to emit light.

The organic EL panel 100 having the above-described configuration employs an active matrix type display in which display control is performed for each of the pixels 110 located at intersections of the gate lines 140 and the source lines 150. Accordingly, the thin film transistors SwTr and DrTr of each of the pixels 110 (the sub pixels 110R, 110G and 110B) cause the corresponding organic EL element 130 to selectively emit light, thus displaying a desired image.

An example of the layout of the plurality of sheet members 71 included in the organic EL panel unit 10 and the effects thereof will be described next with reference to FIGS. 8A and 8B.

[1-3. Example of Layout of Plurality of Sheet Members]

Figure 8A:
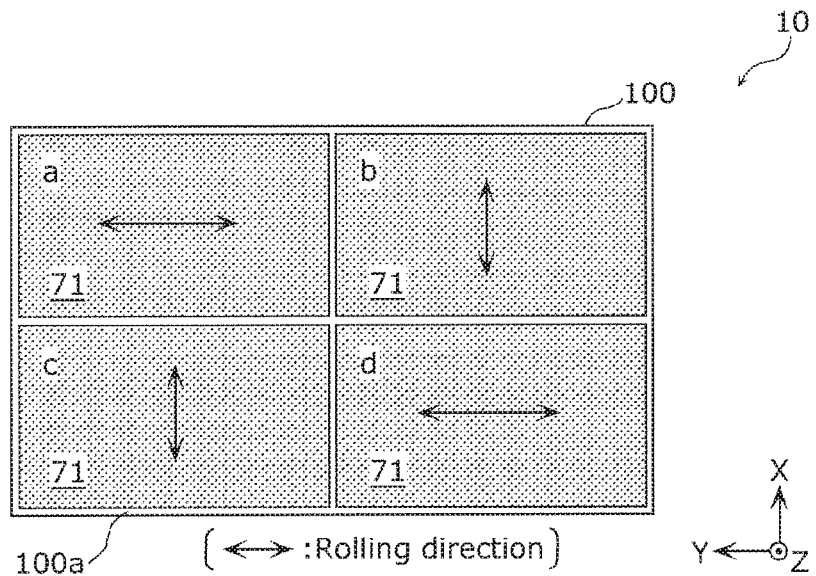
FIG. 8B is a diagram showing curving directions of the plurality of sheet members shown in FIG. 8A.

FIG. 8A is a first diagram showing an example of the layout of the plurality of sheet members 71 according to the embodiment.

Figure 8B:
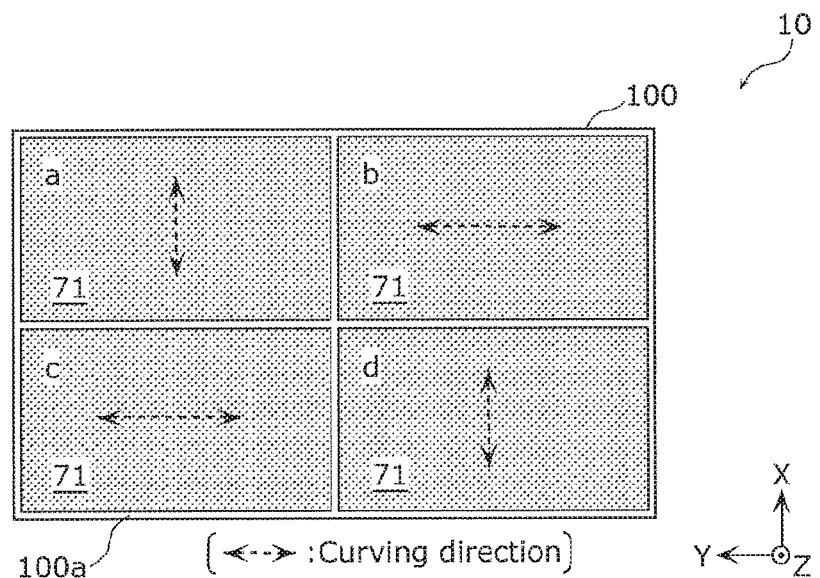

FIG. 8B is a diagram showing the curving directions of the plurality of sheet members 71 shown in FIG. 8A.

FIGS. 8A and 8B each show the layout of the plurality of sheet members 71 in the organic EL panel unit 10 as viewed from the back surface side of the organic EL panel unit 10.

The size of a gap between sheet members 71, the distance from an outermost sheet member 71 to an edge of the organic EL panel 100, and the like are not limited to specific values, and may be determined in consideration of the efficiency of the operation of attaching (bonding) to the panel back surface 100a, and the like. For example, the panel back surface 100a may be filled with the plurality of sheet members 71 without any gap.

In the present embodiment, the organic EL panel unit 10 includes four sheet members 71, and in order to make a distinction, as shown in FIG. 8A, characters "a" to "d" are added for the sake of convenience.

That is, in the organic EL panel unit 10, the panel back surface 100a of the organic EL panel 100 includes a sheet member_a, a sheet member_b, a sheet member_c and a sheet member_d that are arranged in a matrix. Also, as shown in FIG. 4, each sheet member 71 is adhesively attached to the panel back surface 100a.

Also, two adjacent sheet members 71 of the four sheet members 71 are disposed so as to have mutually different rolling directions as shown in FIG. 8A.

In FIG. 8A, the sheet member_a and the sheet member_b have mutually different rolling directions, and the sheet member_c and the sheet member_d have mutually different rolling directions. Also, the sheet member_a and the sheet member_c have mutually different rolling directions, and the sheet member_b and the sheet member_d have mutually different rolling directions.

One of two adjacent sheet members 71 of the four sheet members 71 is an example of the first sheet member, and the other sheet member 71 is an example of the second sheet member. For example, the sheet member_a is an example of the first sheet member, and the sheet member_b is an example of the second sheet member.

Also, in this case, the sheet member_d located adjacent to the sheet member_b is an example of the third sheet member.

It is also possible to state that, for example, the sheet member_a and the sheet member_b are disposed such that a portion of the sheet member_a (an end on the sheet member_b side) and a portion of the sheet member_b (an end on the sheet member_a side) are disposed adjacent to each other.

As a result of two adjacent sheet members 71 having mutually different rolling directions as described above, one of the two sheet members 71 functions as a member that suppresses the curvature of the other sheet member.

To be specific, as described above, the sheet members 71 each formed by rolling a metal sheet have a property of easily being curved (warped) in a direction perpendicular to the rolling direction due to a temperature change.

That is, the four sheet members 71 disposed as shown in FIG. 8A are likely to be curved in directions shown in FIG. 8B when the sheet members 71 are heated or cooled.

Here, as shown in FIG. 8B, for example, the curving direction (the direction in which the sheet member is likely to be curved, the same applies hereinafter) of the sheet member_a is equal to a widthwise direction (X axis direction) of the organic EL panel 100, and the curving direction of the sheet member_b located adjacent to the sheet member_a is equal to a lengthwise direction (Y axis direction) of the organic EL panel 100. That is, because the sheet member_b is likely to be curved in the Y axis direction, the sheet member_b functions as a member that is not easily curved in the X axis direction and acts on the adjacent sheet member, namely, the sheet member_a via the organic EL panel 100.

In other words, when the sheet member_a is curved in the X axis direction, the sheet member_b whose curving direction is the Y axis direction suppresses the curvature of the sheet member_a.

Also, when the sheet member_b is curved in the Y axis direction, because the sheet member_a whose curving direction is the X axis direction is disposed adjacent to the sheet member_b, the displacement of an end portion of the sheet member_b in the Z axis direction, the end portion being on the sheet member_a side, is suppressed. In other words, the curvature of the sheet member_b is suppressed.

As a result, as compared with, for example, a configuration in which one sheet member 71 is disposed such that it covers the region covered with the two sheet members, namely, the sheet member_a and the sheet member_b and the rolling direction is parallel to the Y axis direction, the curvature of a center portion in the V axis direction in the X axis direction is suppressed.

Also, as compared with, for example, the configuration in which one sheet member 71 is disposed such that it covers the region covered with the two sheet members, namely, the sheet member_a and the sheet member_b and the rolling direction is parallel to the X axis direction, the curvature of a portion on the left side of FIG. 8B in the Y axis direction is suppressed.

The effect of suppressing the curvature of one of two adjacent sheet members 71 by the other sheet member can be attained in two sheet members 71 that are disposed vertically (in the X axis direction).

For example, as shown in FIG. 8A, the sheet member_b and the sheet member_d disposed below the sheet member_b have different rolling directions. Accordingly, the curving direction of the sheet member_b and the curving direction of the sheet member_d do not match. To be specific, the curving directions are separated by about 90 degrees.

That is, as shown in FIG. 8B, when the sheet member_b is curved in the Y axis direction, the curvature of the sheet member_b is suppressed by the sheet member_d whose curving direction is the X axis direction.

When the sheet member_d is curved in the X axis direction, the curvature of the sheet member_d is suppressed by the sheet member_c whose curving direction is the Y axis direction.

Furthermore, when the sheet member_c is curved in the Y axis direction, the curvature of the sheet member_c is suppressed by the sheet member_a whose curving direction is the X axis direction.

As described above, in the case where the four sheet members 71 that are arranged in the layout shown in FIG. 8A are adhesively attached to the panel back surface 100a of the organic EL panel 100, each sheet member 711 is disposed to have a relationship in which its curvature is suppressed by at least one adjacent sheet member 71.

As a result, for example, as compared with the configuration in which one sheet member 71 sized to cover substantially the entirety of the panel back surface 100a of the organic EL panel 100 is adhesively attached to the panel back surface 100a, the deformation of the entire organic EL panel 100 (the organic EL panel unit 10) is suppressed.

[1-4. Advantageous Effects, etc.]

As described above, the organic EL panel unit 10 included in the organic EL display apparatus 1 according to the present embodiment includes the organic EL panel 100 and the plurality of sheet members 71 attached to the panel back surface 100a.

The plurality of sheet members 71 includes two sheet members 71 (a first sheet member and a second sheet member). The first sheet member (71) and the second sheet member (71) are attached to the panel back surface 100a such that a portion of one of the first sheet member (71) and the second sheet member (71) is disposed adjacent to a portion of the other sheet member, and the first sheet member (71) and the second sheet member (71) have mutually different rolling directions.

With this configuration, for example, as with the sheet member_a and the sheet member_b described above, one of two sheet members 71 can function as a member that suppresses the curvature of the other sheet member.

To be specific, in the organic EL panel unit 10 according to the present embodiment, the plurality of sheet members 71 are disposed such that the plurality of sheet members 71 cover the panel back surface 100a. With this configuration, it is possible to obtain substantially the same heat dissipation effect as that obtained in the configuration in which one sheet member 71 covers the panel back surface 100a.

Furthermore, the plurality of sheet members 71 are attached to the panel back surface 100a such that the rolling direction of at least one of the plurality of sheet members 71 is different from the rolling direction of a sheet member 71 located adjacent to the sheet member 71.

With this configuration, the deformation of the organic EL panel 100 (the organic EL panel unit 10) is suppressed as compared with the configuration in which the panel back surface 100a is covered with only one sheet member 71.

That is, with the organic EL panel unit 10, it is possible to efficiently perform heat dissipation from the organic EL panel 100 and suppress the deformation of the organic EL panel 100 caused by a temperature change.

Also, in the present embodiment, two sheet members 71 (a first sheet member and a second sheet member) are arranged in a direction parallel to the panel back surface 100a and are adhesively attached to the panel back surface 100a.

That is, to be brief, two sheet members 71 arranged side by side are bonded to the panel back surface 100a. With this configuration, the heat dissipation from the organic EL panel 100 by the two sheet members 71 can be efficiently performed, and the effect of suppressing the curvature of one of the two sheet members 71 by the other sheet member can be obtained.

Also, in the present embodiment, the plurality of sheet members 71 includes, for example, the sheet member_d that does not overlap the sheet member_a and is disposed adjacent to the sheet member_b. Also, the sheet member_d is adhesively attached to the panel back surface 100a such that the rolling direction of the sheet member_d is different from the rolling direction of the sheet member_b or the sheet member_a (see FIG. 8A).

With this configuration, in a state in which three or more sheet members 71 are disposed, the effect of suppressing the curvature of one of the two sheet members 71 by the other sheet member can be continuously exerted in a direction in which the sheet members 71 are arranged.

That is, in the present embodiment, four sheet members 71 are disposed in an arrangement as shown in FIG. 8A, but five or more sheet members 71 may be attached to the panel back surface 100a such that adjacent sheet members 71 have different rolling directions. In this case as well, it is possible to implement an organic EL panel unit 10 in which heat dissipation from the organic EL panel 100 is efficiently performed and the deformation of the organic EL panel 100 caused by a temperature change can be suppressed.

As described above, in the organic EL panel unit 10, there are a variety of variations for the layout of the plurality of sheet members 71.

Accordingly, a variety of variations for the layout of the plurality of sheet members 71 that can be used in the organic EL panel unit 10 will be described below, focusing on differences from the embodiment described above.

[2-1. Variation 1]

Figure 9A:
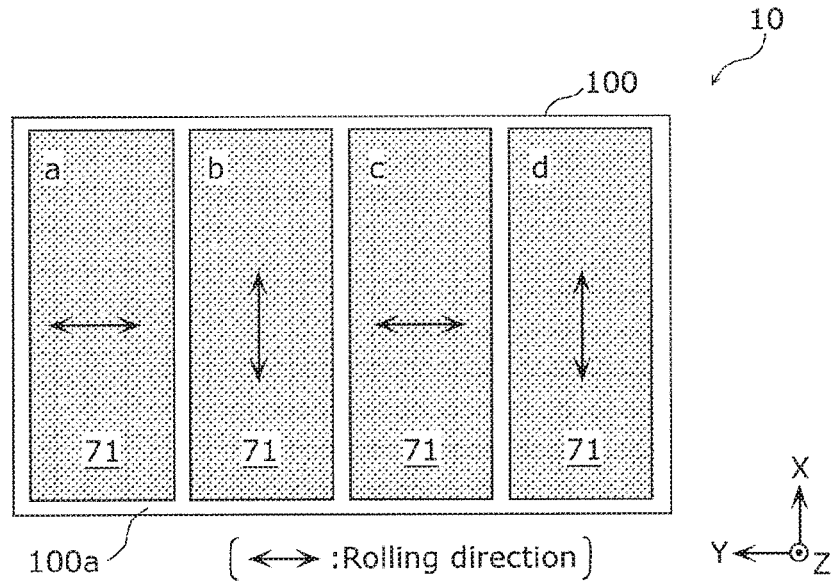
FIG. 9A is a diagram showing an example of the layout of a plurality of sheet members according to Variation 1 of the embodiment.

FIG. 9A is a diagram showing a layout of a plurality of sheet members 71 according to Variation 1 of the embodiment.

In an organic EL panel unit 10 shown in FIG. 9A, four sheet members 71 (sheet members_a to d) elongated in a widthwise direction (X axis direction) of an organic EL panel 100 are arranged in a lengthwise direction (Y axis direction) of the organic EL panel 100.

Also, in FIG. 9A, for example, the sheet member_a and the sheet member_b are attached to a panel back surface 100a so as to have mutually different rolling directions. Furthermore, the sheet member_b is disposed between the sheet member_a and the sheet member_c, and the sheet member_c is adhesively attached to the panel back surface 100a so as to have a rolling direction different from the rolling direction of the sheet member_b.

In this way, a plurality of sheet members 71 aligned in the lengthwise direction of the organic EL panel 100 are adhesively attached to the panel back surface 100a such that adjacent sheet members do not have the same rolling direction in the direction in which the sheet members 71 are aligned.

With this configuration, each sheet member 71 functions as a heat-dissipation member of the organic EL panel 100 and also produces the effect of suppressing the curvature of at least one adjacent sheet member 71.

Accordingly, with the organic EL panel unit 10 according to the present variation, efficient heat dissipation from the organic EL panel 100 and suppression of the deformation of the organic EL panel 100 caused by a temperature change are implemented.

[2-2. Variation 2]

Figure 9B:
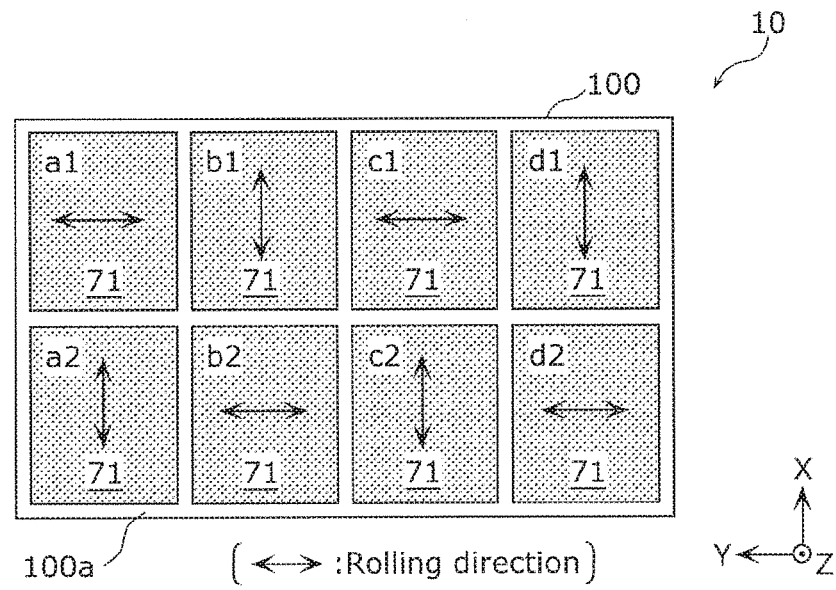
FIG. 9B is a diagram showing a layout of a plurality of sheet members according to Variation 2 of the embodiment.

FIG. 9B is a diagram showing a layout of a plurality of sheet members 71 according to Variation 2 of the embodiment.

An organic EL panel unit 10 shown in FIG. 9B includes eight sheet members 71.

The eight sheet members 71 are composed of a sheet member sequence of four horizontally aligned sheet members (sheet members_a1 to d1) and a sheet member sequence of four horizontally aligned sheet members (sheet members_a2 to d2), the sheet member sequence being disposed below the above sheet member sequence.

In this layout, the sheet members 71 are disposed such that two vertically adjacent sheet members 71 have mutually different rolling directions.

Accordingly, each of the eight sheet members 71 has a rolling direction different from the rolling directions of two or three other sheet members 71 that are disposed adjacent to the sheet member 71 in the X axis direction and the Y axis direction. Accordingly, the curvature of one sheet member 71 is suppressed by two or three sheet members 71 that are disposed adjacent to the sheet member 71. Also, the sheet member 71 can function as a member that suppresses the curvature of the two or three sheet members 71.

As described above, each sheet member 71 functions as a heat-dissipation member of the organic EL panel 100 and also produces the effect of suppressing the curvature of the two or three adjacent sheet members 71.

Accordingly, with the organic EL panel unit 10 according to the present variation, efficient heat dissipation from the organic EL panel 100 and suppression of the deformation of the organic EL panel 100 caused by a temperature change are implemented.

[2-3. Variation 3]

Figure 9C:
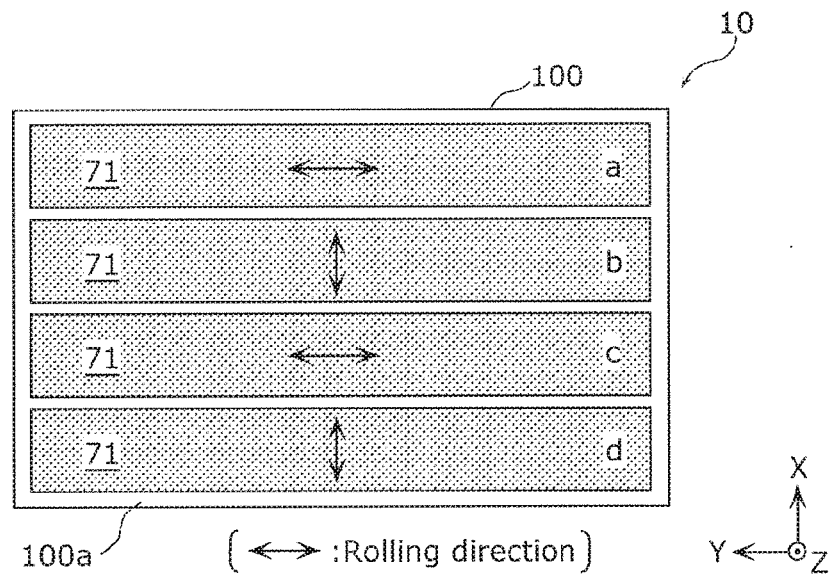
FIG. 9C is a diagram showing a layout of a plurality of sheet members according to Variation 3 of the embodiment.

FIG. 9C is a diagram showing a layout of a plurality of sheet members 71 according to Variation 3 of the embodiment.

In an organic EL panel unit 10 shown in FIG. 9C, four sheet members 71 (sheet members_a to d) elongated in a lengthwise direction (Y axis direction) of an organic EL panel 100 are arranged in a widthwise direction (X axis direction) of the organic EL panel 100. Also, adjacent sheet members 71 have mutually different rolling directions.

In this way, a plurality of sheet members 71 aligned in the widthwise direction of the organic EL panel 100 are adhesively attached to the panel back surface 100a such that adjacent sheet members do not have the same rolling direction in the direction in which the sheet members 71 are aligned.

With this configuration, each sheet member 71 functions as a heat-dissipation member of the organic EL panel 100 and also produces the effect of suppressing the curvature of at least one adjacent sheet member 71.

Accordingly, with the organic EL panel unit 10 according to the present variation, efficient heat dissipation from the organic EL panel 100 and suppression of the deformation of the organic EL panel 100 caused by a temperature change are implemented.

[2-4. Variation 4]

Figure 9D:
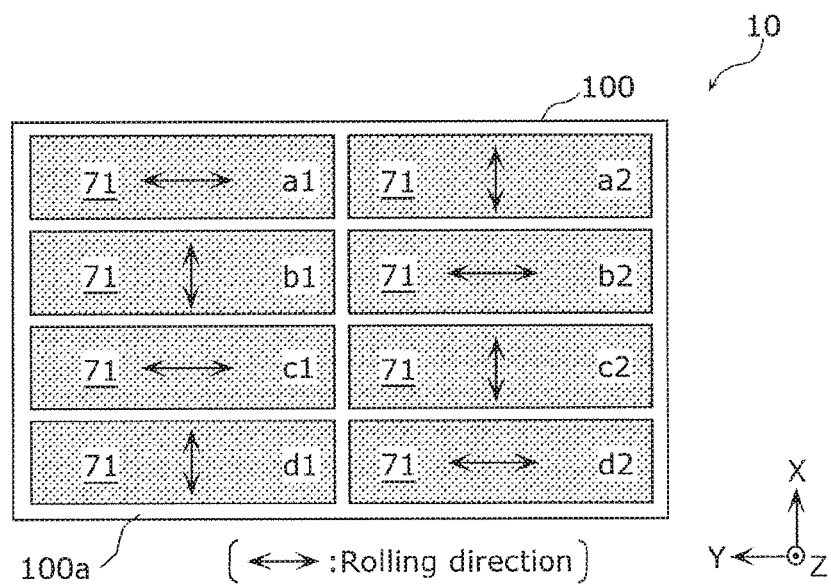
FIG. 9D is a diagram showing a layout of a plurality of sheet members according to Variation 4 of the embodiment.

FIG. 9D is a diagram showing a layout of a plurality of sheet members 71 according to Variation 4 of the embodiment.

An organic EL panel unit 10 shown in FIG. 9D includes eight sheet members 71.

The eight sheet members 71 are composed of a sheet member sequence of four vertically aligned sheet members (sheet members_a1 to d1) and a sheet member sequence of four vertically aligned sheet members (sheet members_a2 to d2), the sheet member sequence being disposed laterally of the above sheet member sequence.

That is, the eight sheet members 71 are disposed in a layout obtained by reversing the vertical and horizontal directions (the X axis direction and the Y axis direction) of the layout shown in FIG. 9B.

Even when the sheet members 71 are disposed as described above, each of the eight sheet members 71 has a rolling direction different from the rolling directions of two or three other sheet members 71 that are disposed adjacent to the sheet member 71 in the X axis direction and the Y axis direction. Accordingly, each sheet member 71 functions as a heat-dissipation member of the organic EL panel 100 and also produces the effect of suppressing the curvature of the two or three adjacent sheet members 71.

With this configuration, efficient heat dissipation from the organic EL panel 100 and suppression of the deformation of the organic EL panel 100 caused by a temperature change are implemented.

Here, the curvature of each of the plurality of sheet members 71 attached to the panel back surface 100a is suppressed by other sheet members 71, but it is difficult to completely suppress the deformation of each of the plurality of sheet members 71.

However, by reducing the size of each of the plurality of sheet members 71, it is possible to reduce the influence of the deformation of each sheet member 71 on the shape of the organic EL panel 100.

That is, the deformation as a whole is suppressed (the maximum amount of deformation is reduced) in the organic EL panel unit 10 according to Variation 2 shown in FIG. 9B as compared with the organic EL panel unit 10 according to Variation 1 shown in FIG. 9A.

Also, the deformation as a whole is suppressed (the maximum amount of deformation is reduced) in the organic EL panel unit 10 according to Variation 4 shown in FIG. 9D as compared with the organic EL panel unit 10 according to Variation 3 shown in FIG. 9C.

An increase in the number of sheet members 71 attached to the panel back surface 100a may make, for example, the process of attaching the plurality of sheet members 71 to the panel back surface 100a complicated. Accordingly, the number of sheet members 71 and the layout of the sheet members 71 may be determined according to, for example, the size (the number of inches) of the organic EL panel 100 or the like.

[2-5. Variation 5]

Figure 10A:
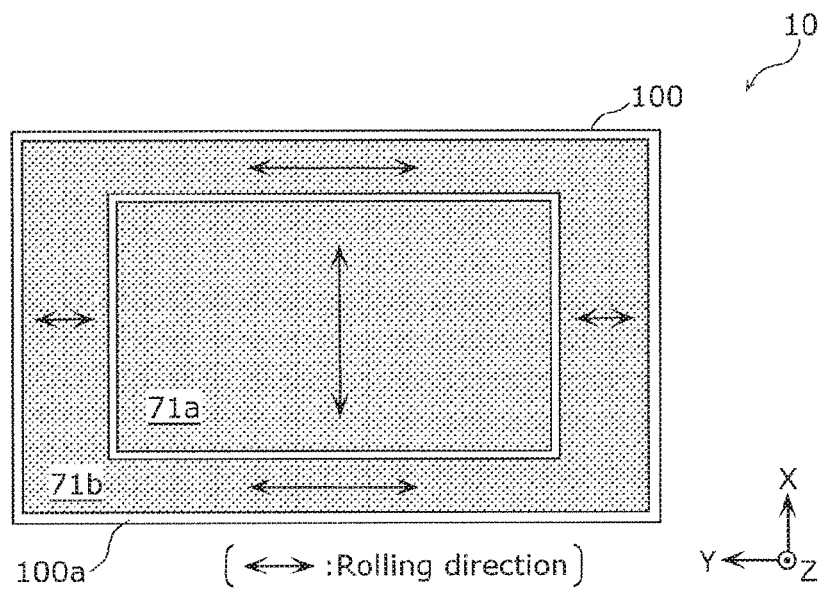
FIG. 10A is a diagram showing a layout of a plurality of sheet members according to Variation 5 of the embodiment.

FIG. 10A is a diagram showing a layout of sheet members 71a and 71b according to Variation 5 of the embodiment.

An organic EL panel unit 10 shown in FIG. 10A includes a sheet member 71b disposed in a perimeter region of a panel back surface 100a and a sheet member 71a disposed in an inner region located within the perimeter region of the panel back surface 100a.

Also, the sheet member 71b has a hole having a size and a shape corresponding to those of the sheet member 71a, and the sheet member 71a is disposed at the position of the hole. That is, the sheet member 71b is disposed on the panel back surface 100a so as to surround the sheet member 71a.

In other words, the layout of the sheet member 71a and the sheet member 71b according to the present variation is not the same as, for example, the layout of the embodiment described above in which the rectangular sheet members 71 are simply arranged in the widthwise direction (X axis direction) and the lengthwise direction (Y axis direction) of the organic EL panel 100.

However, the present variation is the same as the embodiment described above in that a portion of one of two sheet members (in the present variation, the sheet members 71a and 71b) is disposed adjacent to a portion of the other sheet member, and the sheet members mutually different rolling directions.

According to the present variation, to be specific, the sheet member 71b whose rolling direction is the Y axis direction is disposed so as to surround the sheet member 71a whose rolling direction is the X axis direction.

That is, because the curving direction of the sheet member 71a, which is a center portion, is the Y axis direction and the curving direction of the sheet member 71b surrounding the sheet member 71a is the X axis direction, the sheet member 71a and the sheet member 71b are in a relationship in which they suppress their curvatures each other. Also, substantially the entire panel back surface 100a is covered with the sheet member 71a and the sheet member 71b.

With this configuration, efficient heat dissipation from the organic EL panel 100 and suppression of the deformation of the organic EL panel 100 caused by a temperature change are implemented.

[2-6. Variation 6]

Figure 10B:
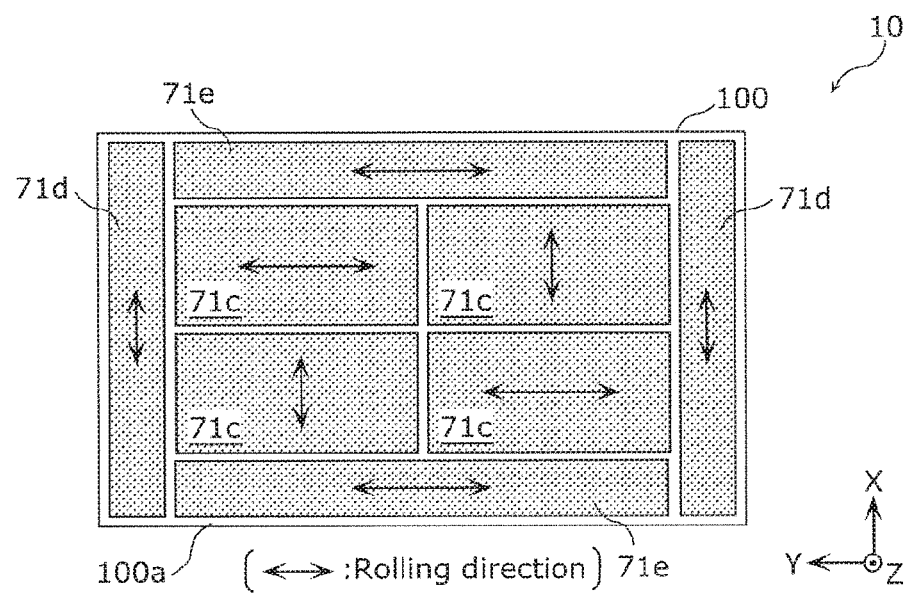
FIG. 10B is a diagram showing a layout of a plurality of sheet members according to Variation 6 of the embodiment.

FIG. 10B is a diagram showing a layout of sheet members 71c, 71d and 71e according to Variation 6 of the embodiment.

An organic EL panel unit 10 shown in FIG. 10B includes a plurality of sheet members 71d and 71e disposed in a perimeter region of a panel back surface 100a and a plurality of sheet members 71c disposed in an inner region of the panel back surface 100a.

That the layout of the plurality of sheet members 71c, 71d and 71e according to the present variation is a layout obtained by subdividing the layout of the sheet members 71a and 71b according to Variation 5 described above (see FIG. 10A).

To be specific, the sheet members 71d and the sheet members 71e are adhesively attached to the perimeter region of the panel back surface 100a such that the sheet member 71d and the sheet member 71e disposed adjacent to each other in the perimeter region have rolling directions that do not match each other.

Also, the plurality of sheet members 71c are adhesively attached to the inner region of the panel back surface 100a such that their rolling direction does not match the rolling directions of adjacent sheet members 71c.

That is, the curvature of each of the plurality of sheet members 71c attached to the inner region of the panel back surface 100a is suppressed by at least one adjacent sheet member 71c.

Furthermore, the effect of suppressing curvatures also occurs between the sheet members 71c disposed in the inner region and the sheet members 71d or 71e disposed in the perimeter region. To be specific, one of the sheet members 71d and 71e disposed adjacent to a sheet member 71c has a rolling direction different from the rolling direction of the sheet member 71c. That is, the sheet member 71c and the sheet member 71d or 71e are in a relationship in which one of the sheet members suppresses the curvature of the other sheet member.

For example, when focus is given to the upper left sheet member 71c of the four sheet members 71c shown in FIG. 10B, the rolling direction of the upper left sheet member 71c matches the rolling direction of the sheet member 71e disposed above the upper left sheet member 71c. However, the rolling direction of the upper left sheet member 71c does not match the rolling direction of the sheet member 71d disposed on the left side of the upper left sheet member 71c. Accordingly, the upper left sheet member 71c and the sheet member 71d are in a relationship in which one of the sheet members suppresses the curvature of the other sheet member.

Also, substantially the entire panel back surface 100a is covered with the plurality of sheet members 71c, 71d and 71e described above.

With this configuration, efficient heat dissipation from the organic EL panel 100 and suppression of the deformation of the organic EL panel 100 caused by a temperature change are implemented.

To be more specific, the deformation as a whole is suppressed (the maximum amount of deformation is reduced) in the organic EL panel unit 10 according to Variation 6 shown in FIG. 10B as compared with the organic EL panel unit 10 according to Variation 5 shown in FIG. 10A.

If, for example, the sheet member 71d is taken as an example of the first sheet member, either one of the sheet members 71c and 71e is an example of the second sheet member, and the other sheet member is an example of the third sheet member.

[2-7. Variation 7]

FIG. 10C is a diagram showing a layout of sheet members 71c and 71f according to variation 7 of the embodiment.

An organic EL panel unit 10 shown in FIG. 10C includes a plurality of sheet members 71f disposed in a perimeter region of a panel back surface 100a and a plurality of sheet members 71c disposed in an inner region located within the perimeter region of the panel back surface 100a.

That is, the layout of the plurality of sheet members 71c and 711 according to the present variation is a layout obtained by further subdividing the layout of the sheet members 71c, 71d and 71e according to Variation 6 described above (see FIG. 10B).

To be specific, the plurality of sheet members 71f are adhesively attached to the perimeter region of the panel back surface 100a such that their rolling direction does not match the rolling directions of adjacent sheet members 71f. Also, the plurality of sheet members 71c are adhesively attached to the inner region of the panel back surface 100a such that their rolling direction does not match the rolling direction of adjacent sheet members 71c.

That is, the curvature of each of the plurality of sheet members 71f attached to the perimeter region of the panel back surface 100a is suppressed by at least one adjacent sheet member 71f. Also, the curvature of each of the plurality of sheet members 71c attached to the inner region of the panel back surface 100a is suppressed by at least one adjacent sheet member 71c.

Furthermore, the effect of suppressing curvatures also occurs between the sheet members 71c in the inner region and the sheet members 71f in the perimeter region. To be specific, when a sheet member 71c and a sheet member 71f are disposed adjacent to each other and have mutually different rolling directions, the sheet member 71c and the sheet member 71f are in a relationship in which one of the sheet members suppresses the curvature of the other sheet member.

Also, substantially the entire panel back surface 100a is covered with the plurality of sheet members 71c and the plurality of sheet members 71f.

With this configuration, efficient heat dissipation from the organic EL panel 100 and suppression of the deformation of the organic EL panel 100 caused by a temperature change are implemented.

In the organic EL panel unit 10 (see FIG. 10A) according to Variation 5 described above, one sheet member 71b is disposed in the perimeter region of the panel back surface 100a, and thus for example, there is a possibility that the deformation (warpage) of the edge of the organic EL panel 100 may be relatively large.

However, by disposing a plurality of sheet members 71f in the perimeter region of the panel back surface 100a as in the present variation, the influence of deformation of the sheet members 71f on the shape of the organic EL panel 100 can be reduced.

That is, an outer edge of the sheet members 71f disposed in the perimeter region of the panel back surface 100a is a portion in which deformation caused by a temperature change is likely to take place because there are no other sheet members outside the outer edge.

To address this, a configuration is used in which the number of sheet members 71f disposed in the perimeter region of the panel back surface 100a is increased (the size of each sheet member 71f is reduced) and the sheet members 71f are disposed such that adjacent sheet members 71f have mutually different rolling directions. With this configuration, the amount of deformation at the outer edge of each sheet member 71f becomes relatively small, and as a result, the deformation at the edge of the organic EL panel 100 is suppressed.

In other words, for example, the deformation as a whole is suppressed (the maximum amount of deformation is reduced) in the organic EL panel unit 10 according to Variation 7 shown in FIG. 10C as compared with the organic EL panel unit 10 according to Variation 5 shown in FIG. 10A.

[2-8. Variation 8]

FIG. 11 is a diagram showing a portion of a layout of a plurality of sheet members 72 according to Variation 8 of the embodiment.

An organic EL panel unit 10 shown in FIG. 11 includes a plurality of triangular sheet members 72. The plurality of sheet members 72 are adhesively attached to a panel back surface 100a such that their rolling direction is different from the rolling direction of adjacent sheet members 72.

To be specific, the sheet members 72 have an equilateral triangular shape, and when focus is given to one sheet member 72, there are three sheet members 72 that are disposed along the sides of the one sheet member 72. Also, the rolling direction of the one sheet member 72 is separated from the rolling direction of each of the three sheet members 72 by 60 degrees or 120 degrees).

That is, the curving direction of the one sheet member 72 is separated from the curving direction of each of the three sheet members 72 by 60 degrees (or 120 degrees). Accordingly, the one sheet member 72 and the three sheet members 72 are in a relationship in which they suppress their curvatures each other.

In the organic EL panel unit 10 according to the present variation, the above-described relationship between the one sheet member 72 and the three sheet members 72 is two-dimensionally spread in a continuous manner on the panel back surface 100a. As a result, efficient heat dissipation from the organic EL panel 100 and suppression of the deformation of the organic EL panel 100 caused by a temperature change are implemented.

Also, in the organic EL panel unit 10 according to the present variation, by producing a plurality of sheet members 72 having the same equilateral triangular shape, a wide region of the panel back surface 100a can be covered with the plurality of sheet members 72.

[2-9. Variation 9]

Figure 12A:
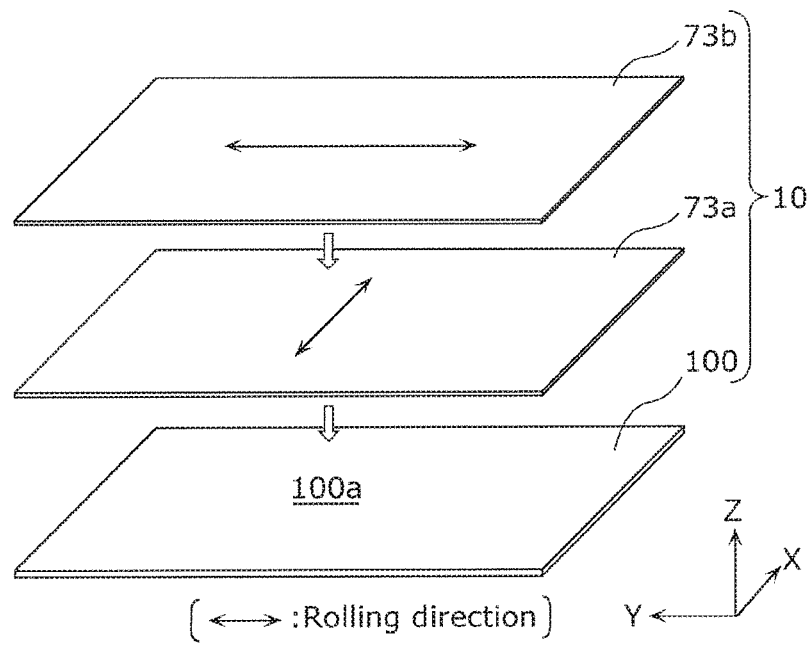
FIG. 12A is a diagram showing a layout of a plurality of sheet members according to Variation 9 of the embodiment.

FIG. 12A is a diagram showing a layout of sheet members 73a and 73b according to Variation 9 of the embodiment.

Figure 12B:
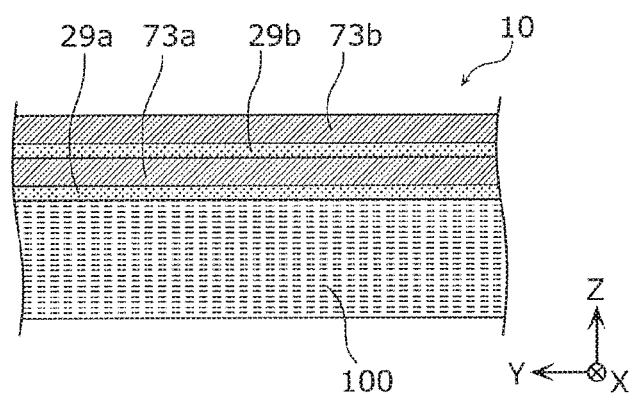
FIG. 12B is a partial cross-sectional view of an organic EL panel unit according to Variation 9 of the embodiment.

FIG. 12B is a partial cross-sectional view of an organic EL panel unit 10 according to Variation 9 of the embodiment.

As shown in FIGS. 12A and 12B, in the organic EL panel unit 10 according to the present variation, the sheet member 73a and the sheet member 73b are stacked in a thickness direction (Z axis direction) of the organic EL panel 100 and attached to a panel back surface 100a.

The sheet member 73a and the sheet member 73b are an example of the first sheet member and the second sheet member that are attached to the panel back surface 100a such that a portion of one of the first sheet member and the second sheet member is disposed adjacent to a portion of the other sheet member (in the Z axis direction) and the first sheet member and the second sheet member have mutually different rolling directions.

To be specific, as shown in FIG. 12B, the sheet member 73a is adhesively attached to the panel back surface 100a by an adhesive member 29a, and the sheet member 73b is adhesively attached to a surface of the sheet member 73a, the surface being on a side opposite a side facing the panel back surface 100a, by an adhesive member 29b. That is, the sheet member 73b is attached to the panel back surface 100a via the sheet member 73a.

Also, the sheet member 73a and the sheet member 73b are attached to the panel back surface 100a so as to have mutually different rolling directions.

With the configuration described above, when a temperature change occurs in the organic EL panel unit 10, because the curving direction of the sheet member 73a and the curving direction of the sheet member 73b intersect with each other, the sheet member 73a and the sheet member 73b function as members that suppress their curvatures each other.

Accordingly, with the organic EL panel unit 10 according to the present variation, efficient heat dissipation from the organic EL panel 100 and suppression of the deformation of the organic EL panel 100 caused by a temperature change are implemented.

In the present variation, two sheet members (73a and 73b) are stacked on the panel back surface 100a, but three or more sheet members may be stacked on the panel back surface 100a.

Also, in the case where a plurality of sheet members are stacked, the plurality of sheet members may have different sizes or different shapes.

Also, the sheet member 73b may be attached to the panel back surface 100a by at least a portion of the sheet member 73b being adhesively attached to a surface of the sheet member 73a, the surface being on a side opposite to a side facing the panel back surface 100a.

For example, a case will be considered in which the sheet member 73a is adhesively attached so as to cover only a portion of the panel back surface 100a.

In this case, the sheet member 73b may be attached such that a portion of the sheet member 73b is adhesively attached to a surface of the sheet member 73a, the surface being on a side opposite to a side facing the panel back surface 100a, and the remaining portion of the sheet member 73b is adhesively attached directly to the panel back surface 100a.

That is, as a result of at least a portion of the sheet member 73b being adhesively attached to a surface of the sheet member 73a, the surface being on a side opposite to a side facing the panel back surface 100a, an overlapping portion in which the sheet member 73a and the sheet member 73b overlap with each other in the Z axis direction (are disposed adjacent to each other in the Z axis direction) is formed.

In this case as well, the deformation of the organic EL panel 100 is suppressed as compared with, for example, a configuration in which the entire panel back surface 100a is covered with the sheet member 73a alone.

[2-10. Variation 10]

Figure 13:
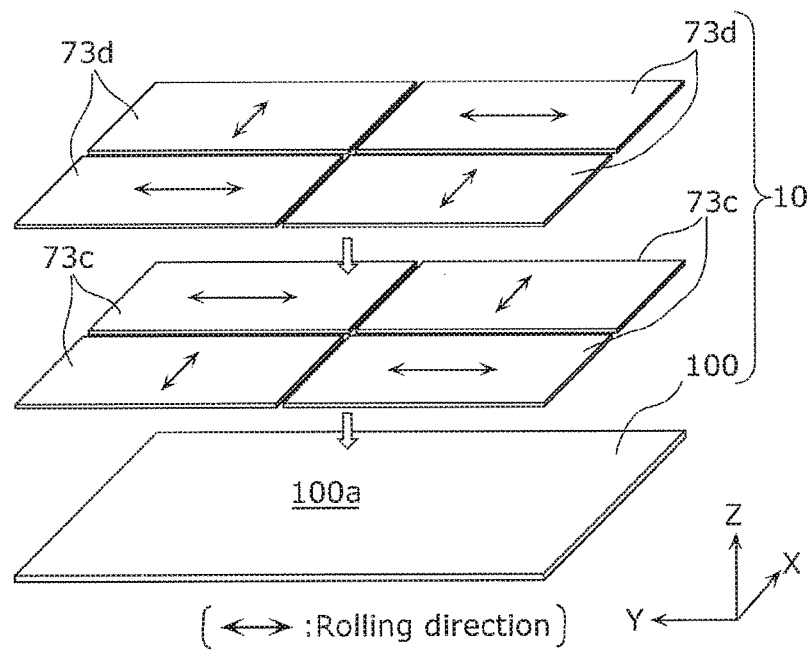
FIG. 13 is a diagram showing a layout of a plurality of sheet members according to Variation 10 of the embodiment.

FIG. 13 is a diagram showing a layout of sheet members 73c and 73d according to Variation 10 of the embodiment.

As shown in FIG. 13, in an organic EL panel unit 10 according to the present variation, a plurality of sheet members are arranged in a thickness direction (Z axis direction) of an organic EL panel 100 and a plurality of sheet members are also arranged in a direction parallel to a panel back surface 100a.

To be specific, the organic EL panel unit 10 according to the present variation includes four sheet members 73c that are adhesively attached directly to the panel back surface 100a and four sheet members 73d that are attached to the panel back surface 100a via the four sheet members 73c.

As with the four sheet members 71 according to the embodiment, the four sheet members 73c are disposed such that two adjacent sheet members 73c have mutually different rolling directions. Also, the four sheet members 73d are also disposed such that two adjacent sheet members 73d have mutually different rolling directions.

That is, the curvature of each of the four sheet members 73c is suppressed by at least one adjacent sheet member 73c. The curvature of each of the four sheet members 73d is suppressed by at least one adjacent sheet member 73d.

Furthermore, according to the present variation, each sheet member 73c has a rolling direction that is different from the rolling direction of the sheet member 73d stacked on the sheet member 73c (disposed adjacent to the sheet member 73c in the Z axis direction).

That is, a pair of the sheet member 73c and the sheet member 73d stacked in the Z axis direction are disposed so as to suppress their curvatures each other.

As described above, with the organic EL panel unit 10 according to the present variation, efficient heat dissipation from the organic EL panel 100 and suppression of the deformation of the organic EL panel 100 caused by a temperature change are implemented.

As described above, the organic EL panel unit 10 according to the present disclosure includes an organic EL panel 100 and a plurality of sheet members (71, etc., the same applies hereinafter) attached to a back surface (panel back surface 100a) of the organic EL panel 100. In short, the plurality of sheet members are arranged in a direction parallel to the panel back surface 100a or in the thickness direction of the organic EL panel 100.

Furthermore, at least two sheet members of a plurality of sheet members, the two sheet members having adjacent portions, are attached to the panel back surface 100a so as to have mutually different rolling directions. With this configuration, efficient heat dissipation from the organic EL panel 100 and suppression of the deformation of the organic EL panel 100 are implemented.

[3. Other Embodiments]

In the foregoing, the embodiment and variations have been described as an example of a technique disclosed in the present application. However, the technique according to the present disclosure is not limited thereto, and is also applicable to embodiments obtained by making modification, replacement, addition, omission and the like as appropriate. It is also possible to develop a new embodiment by combining various structural elements described in the embodiment and variations described above.

Accordingly, hereinafter, other embodiments will be described.

For example, aluminum is used as the material of the sheet members, but the material of the sheet members is not limited to aluminum. As the material of the sheet members, for example, a metal such as copper, stainless steel or titanium may be used. It is also possible to use, as the material of the sheet members, an aluminum alloy composed of, for example, aluminum and copper.

Also, it is possible to, for example, adhesively attach the sheet member 73a according to Variation 9 (see FIG. 12A) to the panel back surface 100a, and adhesively attach the sheet member 71b according to Variation 5 (see FIG. 10A) to the sheet member 73a.

In this case as well, the sheet member 73a and the sheet member 71b that are disposed adjacent to each other in the thickness direction of the organic EL panel 100 in the perimeter region of the panel back surface 100a function as members that suppress their curvatures each other. That is, the deformation of the organic EL panel 100 is suppressed.

Also, it is possible to adhesively attach the sheet member 73a according to Variation 9 to the panel back surface 100a and adhesively attach another sheet member to the central region of the sheet member 73a. Also, at this time, the other sheet member may be adhesively attached so as to have a rolling direction different from the rolling direction of the sheet member 73a.

With this configuration, the deformation of the organic EL panel 100 can be suppressed, and the heat from the central region of the organic EL panel 100 can be dissipated efficiently.

Also, the shape and layout of the plurality of sheet members are not limited to the shapes and layouts shown in the embodiment and Variations 1 to 10 described above.

For example, a plurality of sheet members having an outer shape composed of a curved line or a combination of a curved line and a straight line as viewed from the thickness direction (Z axis direction) of the organic EL panel 100 may be combined and attached to the panel back surface 100a. In this case, it is sufficient that the rolling direction of at least one sheet member is different from the rolling direction of another sheet member disposed adjacent to the sheet member.

In the foregoing, the embodiments have been described as examples of the technique according to the present disclosure. To this end, attached drawings and a detailed description are presented.

Accordingly, the structural elements described in the accompanying drawings and the detailed description include not only structural elements required to solve the problem, but also structural elements that are merely given to illustrate the above technique and thus are not required to solve the problem. For this reason, the structural elements that are not requirements should not be construed as requirements of the present disclosure just because of the fact that they are described in the accompanying drawings and the detailed description.

Also, the embodiments described above are given merely to provide examples of the technique according to the present disclosure, and thus various modifications, replacements, additions, omissions and the like can be made within the scope of the claims or the range of equivalency.

INDUSTRIAL APPLICABILITY

The present disclosure is useful in, for example, an organic EL display apparatus that is required to be thinner, and is applicable as an organic EL display apparatus included in a television receiver, a monitor display, a digital signage device, a portable terminal, a tablet terminal or a table-type display apparatus, as well as, as an organic EL panel unit included in an organic EL display apparatus.

REFERENCE SIGNS LIST

1 Organic EL Display Apparatus
10 Organic EL Panel Unit
21 Chassis
21a Protruding Portion
29, 29a, 29b Adhesive Member
30 Frame
40 Back Cover
50, 51 Circuit Substrate
71, 71a, 71b, 71c, 71d, 71e, 71f, 72, 73a, 73b, 73c, 73d Sheet Member
100 Organic EL Panel
100a Panel Back Surface
101 TFT Substrate
110 Pixel
110B, 110G, 110R Sub Pixel
111 Bank
120 Pixel Circuit
130 Organic EL Element
131 Anode
132 EL Layer
133 Cathode
140 Gate Line
150 Source Line
160 Power Supply Line

The invention claimed is:

1. An organic electroluminescent (EL) panel unit comprising:
an organic EL panel that displays an image on a front surface thereof; and
a plurality of sheet members attached to a panel back surface which is a back surface of the organic EL panel, the plurality of sheet members each being formed by rolling a metal sheet,
wherein the plurality of sheet members include a first sheet member and a second sheet member, and
the first sheet member and the second sheet member are attached to the panel back surface such that a portion of one of the first sheet member and the second sheet member is disposed adjacent to a portion of the other sheet member and the first sheet member and the second sheet member have mutually different rolling directions.

2. The organic EL panel unit according to claim 1, wherein the first sheet member and the second sheet member are arranged in a direction parallel to the panel back surface and adhesively attached to the panel back surface.

3. The organic EL panel unit according to claim 2, wherein the plurality of sheet members include a third sheet member that does not overlap the first sheet member and is disposed adjacent to the second sheet member, and
the third sheet member is adhesively attached to the panel back surface such that the third sheet member has a rolling direction different from the rolling direction of the second sheet member or the first sheet member.

4. The organic EL panel unit according to claim 3, wherein the second sheet member is disposed between the first sheet member and the third sheet member, and
the third sheet member is adhesively attached to the panel back surface such that the third sheet member has a rolling direction different from the rolling direction of the second sheet member.

5. The organic EL panel unit according to claim 1, wherein the first sheet member is adhesively attached to a perimeter region of the panel back surface, and the second sheet member is adhesively attached to an inner region located within the perimeter region of the panel back surface.

6. The organic EL panel unit according to claim 1, wherein the first sheet member is adhesively attached to the panel back surface, and
the second sheet member is attached to the panel back surface by at least a portion of the second sheet member being adhesively attached to a surface of the first sheet member, the surface being on a side opposite a side facing the panel back surface.

7. An organic EL display apparatus comprising:
the organic EL panel unit according to claim 1, and
a back cover disposed to cover at least a portion of the back surface of the organic EL panel unit.

* * * * *